United States Patent [19]

Haferl

[11] Patent Number: 4,516,058
[45] Date of Patent: May 7, 1985

[54] LINEARITY CORRECTED HORIZONTAL DEFLECTION CIRCUIT

[75] Inventor: Peter E. Haferl, Adliswil, Switzerland

[73] Assignee: RCA Corporation, New York, N.Y.

[21] Appl. No.: 363,516

[22] Filed: Mar. 30, 1982

[30] Foreign Application Priority Data

May 11, 1981 [GB] United Kingdom ............... 8114334

[51] Int. Cl.³ .............................................. H01J 29/56
[52] U.S. Cl. .................................... 315/370; 315/408
[58] Field of Search ......................... 315/370, 408, 399

[56] References Cited

U.S. PATENT DOCUMENTS

| | | | |
|---|---|---|---|
| 3,751,707 | 8/1973 | Greiner et al. | 315/27 |
| 3,796,911 | 3/1974 | Ensor et al. | 315/27 |
| 4,176,303 | 11/1979 | Babcock et al. | 315/400 |
| 4,281,275 | 7/1981 | Chapman et al. | 315/370 |

FOREIGN PATENT DOCUMENTS

| | | |
|---|---|---|
| 0013598 | 9/1982 | European Pat. Off. |
| 2535090 | 3/1976 | Fed. Rep. of Germany |
| 2645706 | 4/1977 | Fed. Rep. of Germany |
| 2721591 | 11/1978 | Fed. Rep. of Germany |
| 2732302 | 1/1979 | Fed. Rep. of Germany |
| 3004572 | 8/1981 | Fed. Rep. of Germany |
| 3124424 | 3/1982 | Fed. Rep. of Germany |
| 2044029 | 10/1980 | United Kingdom |

*Primary Examiner*—Theodore M. Blum
*Attorney, Agent, or Firm*—Paul L. Rasmussen; William H. Meise; Scott J. Stevens

[57] ABSTRACT

A linearity correction circuit for use with the horizontal deflection circuit of a television receiver comprises an inductor having two inductor portions. A capacitor, coupled to the S-shaping capacitor of the horizontal deflection circuit, is charged through one portion of the inductor during the horizontal trace interval, and discharged through another portion of the inductor during the horizontal retrace interval in order to provide linearity correction. The inductor may be tapped to allow charge/discharge current switching during the trace interval without introducing beam velocity modulation errors so that the linearity correction circuit may be efficiently combined with horizontal driver circuitry.

11 Claims, 8 Drawing Figures

(a) $V_{H.\ OSC.}$ (b) $V_{CE}$ TRANSISTOR 11

(c) $i_B$ TRANSISTOR 15

(d) $i_H$ (e) $V_{CE}$ TRANSISTOR 15

LINEARITY CORRECTED HORIZONTAL DEFLECTION CIRCUIT

This invention relates to the correction of asymmetrical linearity errors of television receiver horizontal deflection circuits.

BACKGROUND OF THE INVENTION

A television picture is produced by deflecting one or more electron beams across a display screen in a particular pattern. The electron beams strike light-producing phosphor elements to produce a raster. The electron beam intensity is modulated in response to video signal information to produce the desired picture.

Deflection or scanning of the electron beam or beams is provided by a deflection yoke comprising vertical and horizontal deflection coils. Deflection current flowing through the coils generates an electromagnetic field around the coils in the vicinity of the electron beams. The deflection currents are controlled to produce appropriate deflection fields in order to properly deflect the electron beams to generate the desired scanned raster.

During the horizontal trace interval, the main operating components of the horizontal deflection circuit are the horizontal deflection coils of the deflection yoke and the "S-shaping" capacitor, which corrects symmetrical scan nonlinearity caused by the picture tube geometry. The amount of deflection energy necessary to scan a given horizontal line is placed into the yoke at the beginning of each trace interval. This energy circulates in a resonant manner during the trace interval from the yoke into the "S-shaping" capacitor and back into the yoke. The losses in the circuit, if not compensated, cause the circulating energy to decrease during the trace interval, resulting in a smaller deflection current amplitude at the end of trace than at the beginning of trace. This appears as a compressed picture at one side of the screen. This asymmetrical horizontal linearity error is caused by the sum of the losses in the horizontal deflection circuit. Most of these losses occur as resistance losses in the deflection yoke.

To correct this asymmetrical linearity error, several circuit solutions are known. One solution is to use a saturable inductor in series with the yoke. This inductor is in saturation during the second half of the trace interval resulting in an increase in the rate of change of the deflection current; i.e., beam scan velocity. The amount of linearity correction is adjusted by varying the saturation point of the inductor. This adjustment is difficult and in many cases, good linearity is not obtainable because of the large tolerance of the saturable inductor. The use of a saturable inductor may introduce a deflection current offset. A raster centering circuit may then be required. A further disadvantage of this arrangement is the expensive construction of the saturable inductor.

Another solution to linearity correction uses a series-connected variable voltage source which adds some power to the deflection circuit to correct the linearity error. Since the deflection current also passes through the voltage source, a solution of this type is not energy efficient.

SUMMARY OF THE INVENTION

The linearity correction circuit of the present invention comprises an a-c current source which discharges the "S-shaping" capacitor by a particular amount during the retrace interval and charges the "S-shaping" capacitor by the same amount during the trace time. This produces a deflection current having substantially the same slope and amplitude at both the beginning and end of the trace interval to provide a linearity-corrected deflection current waveform This linearity corrector may be combined with the horizontal driver stage of a horizontal deflection circuit.

In accordance with the invention, there is provided a linearity corrected horizontal deflection circuit incorporating a horizontal deflection winding and first switching means switched at a deflection rate and coupled to the winding. A capacitance is coupled to the deflection winding and responsive to the switching of the first switching means for generating a deflection current in the deflection winding which defines a trace and retrace interval of a deflection cycle.

A source of voltage is coupled to an inductance which has first and second windings magnetically coupled to each other.

Second switching means is coupled to the inductance and the capacitance for switching current between the capacitance and the first and second windings alternately in order to provide linearity correction to the deflection current.

BRIEF DESCRIPTION OF THE DRAWING

In the accompanying drawing.

DETAILED DESCRIPTION

Figure 1:
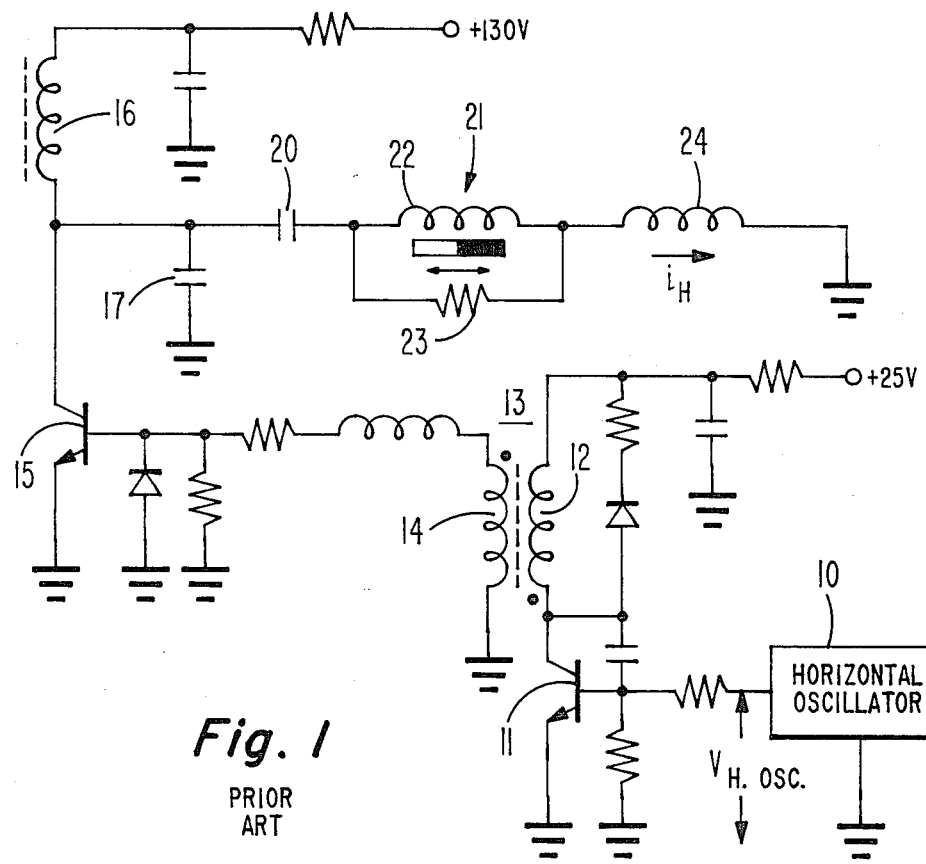
FIG. 1 is a schematic and block diagram of a conventional horizontal deflection driver and linearity correction circuit of the prior art.
Figure 2:
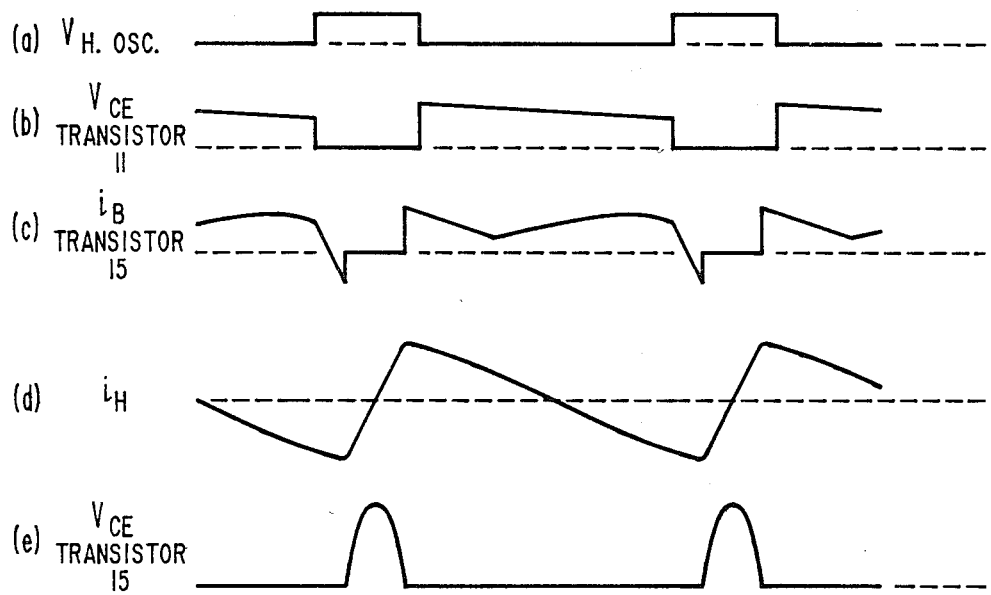
FIGS. 2a–2e show various signal waveforms associated with the circuit of FIG. 1.

FIG. 1 illustrates conventional horizontal driver, deflection and linearity correction circuits such as can be found in the prior art. A horizontal oscillator 10 drives the base of a horizontal driver transistor 11 with a rectangular wave signal such as that shown in FIG. 2a, causing transistor 11 to switch, resulting in a collectoremitter voltage across transistor 11 such as that shown in FIG. 2b. Switching of transistor 11 periodically interrupts the current flow through the primary winding 12 of a horizontal driver transformer 13 causing an induced voltage in the secondary winding 14. Secondary winding 14 is coupled to the base of a horizontal output transistor 15 so that the voltage across winding 14 produces base current which controls the operation of transistor 15. The waveform of base current $i_B$ of transistor 15 is shown in FIG. 2c, while the collector-emitter voltage of transistor 15 is shown in the waveform of FIG. 2e.

Transistor 15 is powered from a +130 volt supply coupled to its collector through a winding 16 of a high voltage transformer (not otherwise shown). The collector of transistor 15 is also coupled to a retrace capacitor 17, an "S-shaping" capacitor 20, a linearity correction circuit 21 comprising a saturable inductor 22 coupled in parallel with a resistor 23 and a horizontal deflection winding 24. The waveform of the horizontal deflection winding current $i_H$ is shown in FIG. 2d. The saturating point of inductor 22 is adjustable via an adjustable permanent magnet bias to increase inductance of the deflection circuit during the first portion of trace in order to reduce peak yoke current and decrease circuit inductance during the last portion of trace in order to increase peak yoke current to provide horizontal scan linearity correction. As previously described, the saturating point of inductor 22 is critical, in some instances making this arrangement complex and difficult to adjust.

Figure 3:
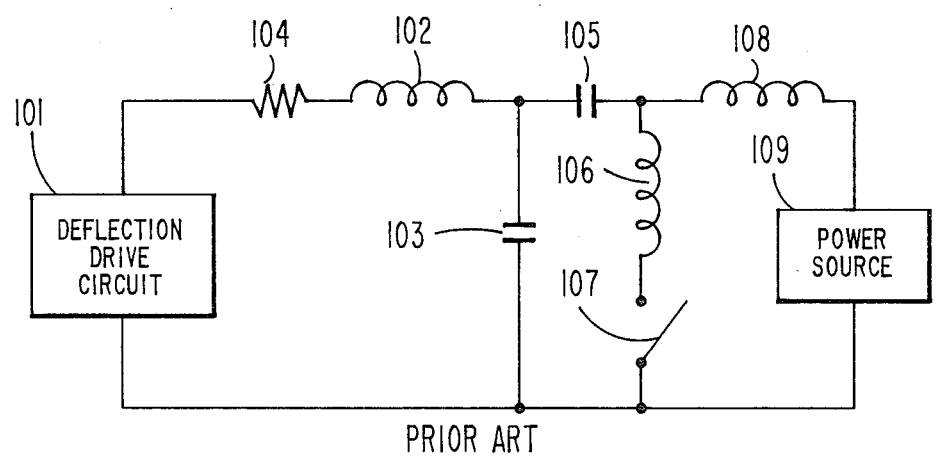
FIG. 3 also illustrates a horizontal deflection circuit known in the prior art.

FIG. 3 illustrates a deflection circuit with linearity correction such as is described in U.S. Pat. No. 4,281,275, "Circuit for Driving Deflection Coil", issued to Chapman et al. During horizontal scan, drive voltage supplied by deflection drive circuit 101 causes current to flow through deflection yoke 102 in series with S-shaping capacitor 103. Linearity correction, required as a result of circuit losses represented by resistor 104, is provided by current supplied from power source 109 via a resonant circuit comprising inductor 108 and capacitors 105 and 103. At the beginning of horizontal retrace, switch 107 closes and a resonant current pulse flows through a resonant circuit comprising inductor 106 and capacitors 103 and 105. The resonant frequencies of the two resonant circuits are chosen to charge and discharge capacitor 105 during the trace and retrace intervals, respectively, in order to provide linearity correction. The impedances presented to the deflection circuit by the resonant circuits will be different since the resonant frequencies are different; therefore, it appears that operation of switch 107 must occur during the horizontal retrace interval to avoid visible scan velocity modulation distortion.

Figure 4:
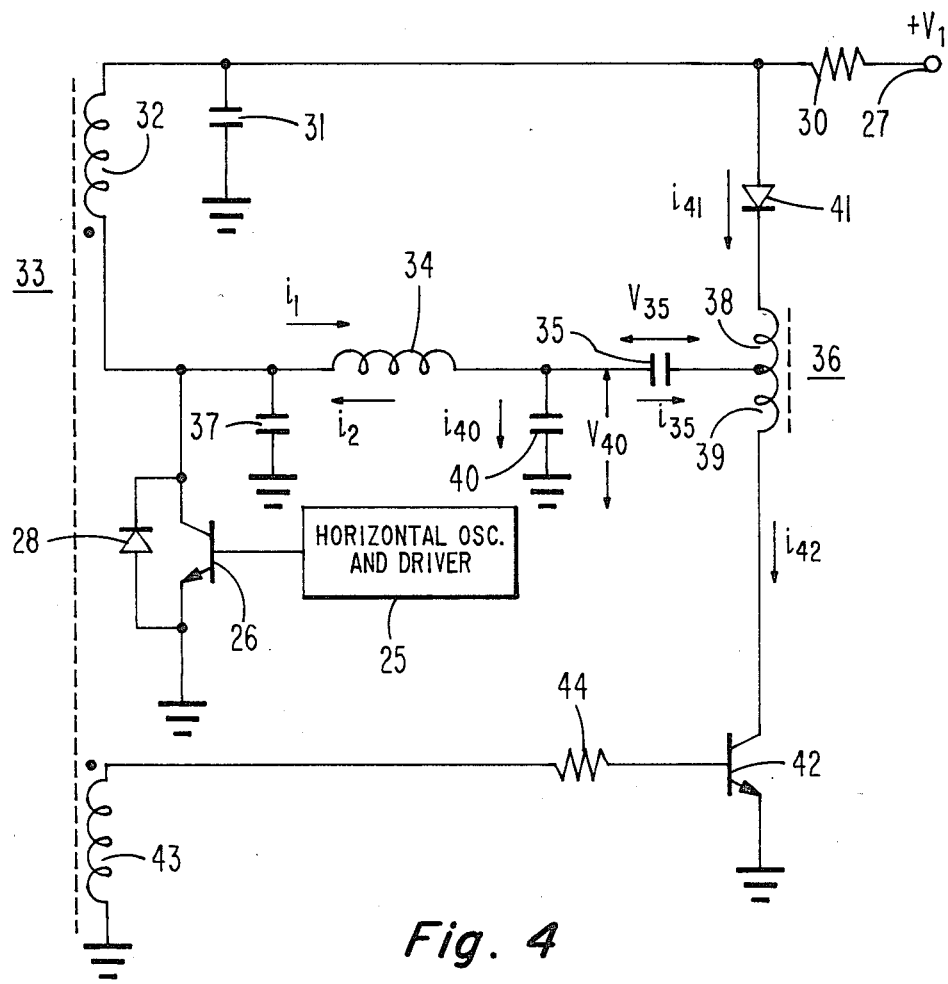
FIG. 4 shows a schematic and block diagram of a horizontal deflection driver and linearity circuit in accordance with the present invention.

FIG. 4 shows a horizontal deflection circuit incorporating linearity correction in accordance with the present invention. A horizontal oscillator and driver 25, incorporating circuitry similar to oscillator 10 and transformer 13 of FIG. 1, applies a substantially rectangular wave switching signal to the base of a horizontal output transistor, which includes an integral damper diode 28 coupled between the collector and emitter electrodes of transistor 26. A source of voltage $+V_1$ at a terminal 27 is coupled to the collector of transistor 26 via an input resistor 30, a filter capacitor 31 and a winding 32 of a high voltage transformer 33. The collector of transistor 26 is also coupled to one end of a horizontal deflection winding 34. The other end of deflection winding 34 is coupled through a coupling capacitor 35 to the intermediate tap on a linearity winding or inductor 36 which divides inductor 36 into portions 38 and 39. Deflection winding 34 is also coupled to a retrace capacitor 37 and an S-shaping capacitor 40. One end of linearity inductor 36 is coupled through a diode 41 and resistor 30 to the $+V_1$ supply. The other end of inductor 36 is coupled to the collector of a transistor 42, the emitter of which is grounded. The base of transistor 42 is coupled to a winding 43 on high voltage transformer 33 via a resistor 44.

In response to the switching signal from oscillator and driver 25, horizontal output transistor 26 is switched on during the horizontal trace interval and switched off during the horizontal retrace interval. During the first portion of the trace interval as the electron beams are being deflected from one side of the screen, conventional yoke current is flowing through deflection winding 34 in a direction indicated by the arrow identified as $i_1$. As the yoke current decreases, the beams approach the center of the screen. The yoke current then reverses direction, flowing in a direction indicated by arrow $i_2$, in order to deflect the beams to the other side of the screen. S-shaping capacitor 40 charges during the first portion of trace and discharges during the second portion of trace to provide S-shaping correction near the sides of the screen. During the trace interval current increases through winding 32 of transformer 33 and through transistor 26 to ground.

Figure 5:
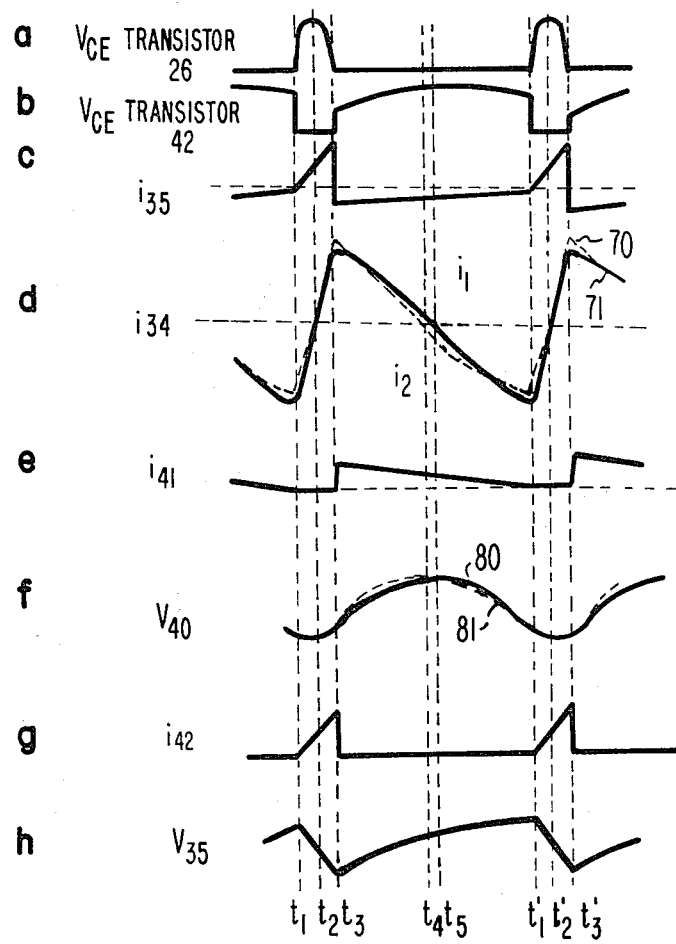
FIGS. 5a–5h illustrate various signal waveforms associated with the circuit of FIG. 4.

Transistor 26 is switched off to initiate horizontal retrace at time $t_1$ of FIG. 5. The collector-emitter voltage $V_{CE}$ of transistor 26 rises rapidly, as can be seen in FIG. 5a. The parallel connection of winding 34 and winding 32 resonates with retrace capacitor 37. Capacitor 37 is charged by current $i_2$ and the current through winding 32 during the first portion of retrace. Circuit losses are replenished by the current through winding 32. Capacitor 37 discharges during the second portion of retrace, beginning at time $t_2$, into windings 32 and 34. This resonance forms the retrace pulses shown in FIG. 5a. The average retrace voltage appears across capacitor 31. Damper diode 28 becomes conductive at time $t_3$ in order to terminate the retrace interval.

The horizontal deflection circuit has heretofore been described without reference to linearity correction. As previously described, resistance losses in the circuit components such as deflection winding 34 cause linearity distortion appearing as a compressed picture near one side of the screen. The dashed line 70 in FIG. 5d illustrates the winding 34 current waveform without linearity correction. The circuit losses cause the deflection current amplitude to be higher during the first portion of the trace interval than during the second portion. Also, the rate at which the deflection current decreases during the first portion of the trace interval is faster than the rate at which the deflection current increases during the second portion of the trace interval. This results in an expanded raster on one side of the screen and a compressed, underscanned raster on the other side of the screen, causing a miscentered raster since the zero crossing of the deflection current does not coincide with center of the display screen.

In accordance with the invention, linearity correction of FIG. 4 operates in the following manner. As previously described, circuit losses are normally replenished during the retrace interval via current flow through winding 32. Linearity correction is obtained by applying a second driving current to the deflection circuit during the trace interval. This current is supplied from the source of potential $+V_1$ through diode 41, portion 38 of winding 36 and capacitor 35 to the parallel connection of deflection winding 34 and capacitor 40. During the retrace interval, current is removed from the deflection circuit through capacitor 35, portion 39 of winding 36 and transistor 42 to ground. Transistor 42 is in saturation during retrace and cut off during the trace interval by the switching signal from winding 43. The currents $i_{41}$ and $i_{42}$, shown in FIGS. 5e and 5g, are associated with linearity correction and affect the deflection current as indicated by the solid line 71 of FIG. 5d. Capacitor 35 provides dc isolation between the linearity correction circuit and the remaining elements of the deflection circuit. During the retrace interval when transistor 42 is conducting, the sum of the voltages across capacitors 35 and 40 is transformed across winding portion 38 and reverse biases diode 41, preventing simultaneous current flow through both portions 38 and 39 of winding 36.

During the second portion of the trace interval, the current $i_{35}$ supplied via diode 41 and winding 38 is in the same direction as the deflection current and therefore increases the deflection current near the end of trace. This increased current also requires that less current be provided via winding 32 to replenish circuit losses. During the retrace interval, conduction of transistor 42 discharges capacitor 40 slightly which reduces the peak deflection current at the beginning of trace, thereby providing equal amplitude deflection currents at the beginning and end of trace, and shown by waveform 71 of FIG. 5d.

Capacitor 40 is charged slightly by the linearity correction current $i_{35}$ during the trace interval which decreases the voltage drop across deflection winding 34. This results in a slower decrease (di/dt) of the deflection current during the first portion of trace, thereby delaying the current zero crossing from time $t_4$ to time $t_5$. At time $t_5$ the voltage across capacitor 40 is the sum of the charges supplied by $i_1$ and $i_{35}$ and is therefore greater than would be the case without linearity correction current $i_{35}$. The solid waveform 80 of FIG. 5f illustrates the voltage across capacitor 40 with linearity correction. The dashed waveform 81 illustrates the voltage across capacitor 40 without linearity correction. The increased voltage across capacitor 40 provided by linearity correction current $i_{35}$ results in a faster increase in deflection current during the second portion of the trace interval and a higher current amplitude at time $t_1'$.

The linearity correction circuit is powered from a relatively high voltage source, for example 130 volts, so that the charge on capacitor 40 does not significantly affect the charge or discharge of capacitor 35. The inductivity of the windings of inductor 36 is very high, causing the current through capacitor 35, shown by the waveform in FIG. 5c, to be sawtooth shaped. This high inductivity causes the charging and discharging portions 38 and 39, respectively, of inductor 36 to appear as current sources during the horizontal trace and retrace intervals. The positive portion of the capacitor 35 current waveform, shown in FIG. 5c, illustrates the discharge of capacitor 35 during horizontal retrace. Capacitor 35 is recharged during the horizontal trace interval, as shown by the negative portion of the waveform, of FIG. 5c, such that the average voltage across capacitor 35 remains constant. The capacitor 35 voltage waveform is shown in FIG. 5h. The collector-emitter voltage of transistor 42 is shown by the waveform in FIG. 5b. The parabolic shape of this waveform during the horizontal trace interval, from time $t_3$ to time $t_1'$, reflects the voltage on S-shaping capacitor 40. The parabola is asymmetrical due to the increasing voltage on capacitor 35 during the trace interval.

Inductor 36, which may comprise a transformer winding, is shown tapped asymmetrically. This provides equal charge and discharge of capacitor 35 to compensate for the unequal duty cycles of the trace and retrace intervals. With the circuit shown in FIG. 4, the impedance of the deflection circuit is not changed during the horizontal trace interval, since transistor 42 is off during trace. As previously described, the charge added to capacitor 35 during the horizontal trace interval changes the deflection current waveform to one that is symmetrical, as can be seen by comparing the uncorrected waveform 70 with the corrected waveform 71 in FIG. 5d. Since production yokes of a given type all have substantially the same linearity error-causing circuit losses, individual adjustment of linearity correction may not be required. The amount of linearity correction may be adjusted, if desired, by varying the inductivity of inductor 36.

Figure 6:
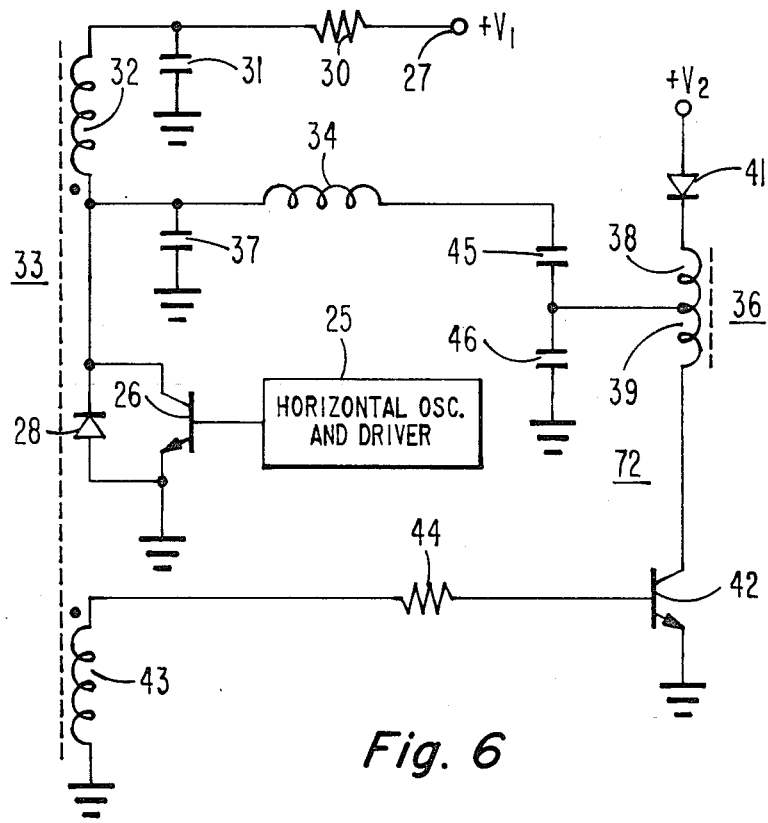
FIG. 6 shows an alternate embodiment of the linearity corrector of the present invention.

FIG. 6 illustrates an alternate embodiment of the linearity correction circuit shown in FIG. 4. Corresponding components are designated with the same reference numerals. The voltage and current waveforms associated with the circuit of FIG. 6 are similar to those shown in FIG. 5. In the circuit of FIG. 6, an S-shaping capacitor 45 is coupled in series with a capacitor 46 of a linearity-correcting circuit 72. The connection between the charging and discharging portions of inductor 36 is coupled to the junction of capacitors 45 and 46. This arrangement requires capacitor 46 to withstand the high amplitude deflection current, but reduces the parabolic voltage developed across capacitor 46 so that the linearity correction circuit may be powered from a lower voltage supply. This supply, shown as $+V_2$ in FIG. 6, may be, for example, 25 volts, as contrasted with the 130 volt supply used with the circuit of FIG. 4.

Figure 7:
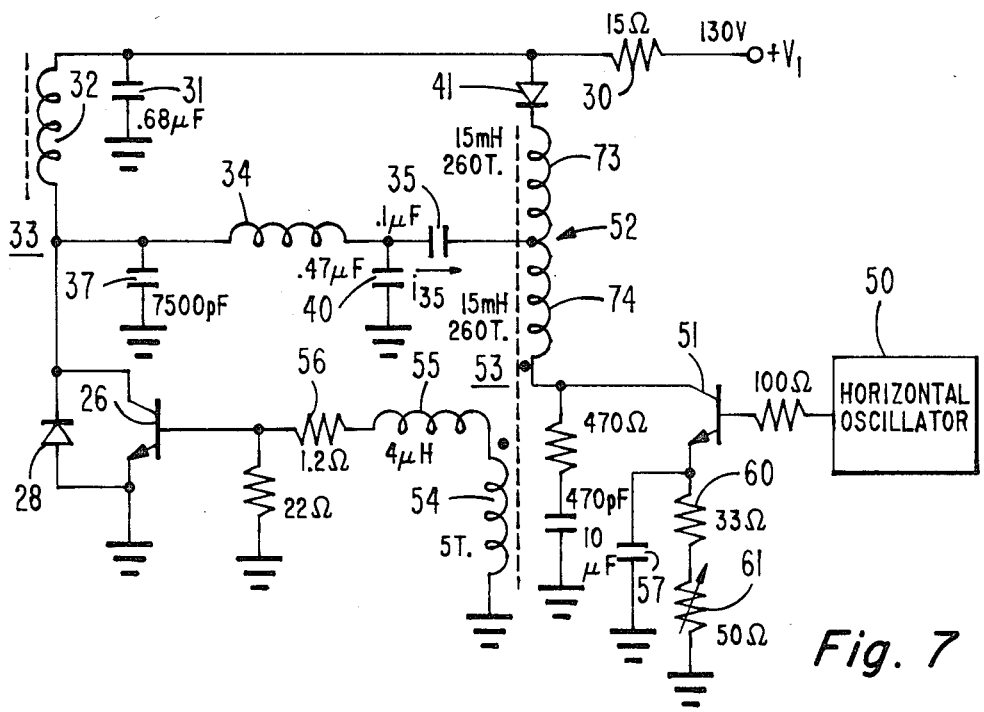
FIG. 7 is a schematic and block diagram of a combined horizontal deflection and linearity correction circuit.

FIG. 7 illustrates a horizontal deflection circuit incorporating both linearity correction and driver circuitry. Components corresponding to components shown in the circuits of FIGS. 4 and 6 are designated with the same reference numerals. A horizontal rate oscillator 50 switches a horizontal driver transistor 51 in a conventional manner. The collector of driver transistor 51 is coupled to one end of an inductor 52, which comprises charge and discharge portions 73 and 74. Transistor 51 operates in combination with inductor 52 in a manner similar to the operation of transistor 42 in the circuits of FIGS. 4 and 6. Inductor 52 may be one winding of a horizontal driver transformer 53. Switching of horizontal output transistor 26 is accomplished by the use of a second winding 54 of transformer 53 which is coupled to the base of transistor 26 via an inductor 55 and a resistor 56.

Figure 8:
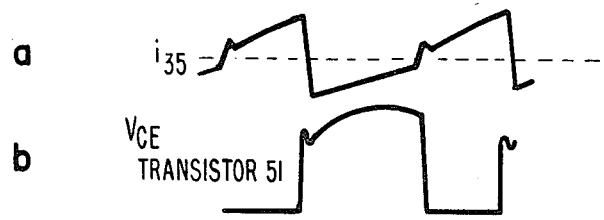
FIGS. 8a–8d illustrate signal waveforms associated with the circuit of FIG. 7.
Figure 8:
Figure 8:
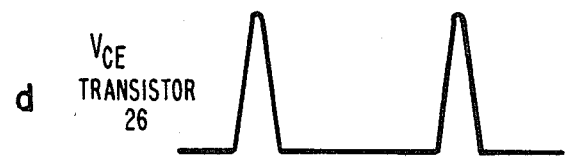

The switching signal from horizontal oscillator 50 controls the linearity correction circuit via operation of transistor 51. Current and voltage waveforms associated with the circuit of FIG. 6 are shown in FIG. 8. These waveforms are similar to those shown with respect to the circuits of FIGS. 4 and 6. The switching of transistor 51, and hence the discharge of capacitor 35, does not occur entirely within the horizontal retrace interval, as contrasted with the circuits of FIGS. 4 and 6. Inductor 52 is therefore tapped symmetrically so that charge/discharge current switching between the portions 73 and 74 of inductor 52 will not change the impedance of inductor 52 as seen by the deflection circuit. Circuit impedance changes may result in electron beam scan velocity modulation, which causes undesirable visible distortion if it occurs during the horizontal trace interval. The use of magnetically coupled inductor portions; e.g., winding both inductor portions on a single core to form a unitary-wound inductor, provides rapid current switching and allows symmetrical tapping to permit current switching during the trace interval without scan modulation errors, thereby permitting the efficient combination of linearity correction and driver circuits.

The combination of a capacitor 57 coupled in parallel with a resistor 60 and a variable resistor 61 to the emitter of transistor 51 provides circuit stabilization. The amount of linearity correction is adjustable by variable resistor 61, which changes the collector-emitter voltage of transistor 51. This controls the switching characteristics of transistor 51, which influences its conduction time.

The leading edge timing of the pulses generated by horizontal oscillator 50 depends upon the storage time of output transistor 26.

During receiver warm-up, the base-emitter voltage of transistor 26 decreases and its base current increases, thereby increasing the storage time of transistor 26. This causes an earlier turn-on of transistor 51 and consequently an increase in linearity correction. Since the yoke losses also increase during warm-up, temperature compensated linearity correction can be obtained using the correct value of resistor 56. A higher resistance value stabilizes the base current but reduces the temperature compensation.

Power consumption of the circuit of FIG. 7 is comparable to the conventional circuit of FIG. 1. The linearity correction circuit of the present invention performs high quality linearity correction at a relatively low cost through efficient use of circuit components. The common voltage supply for deflection, driver and linearity correction results in good tracking between picture width and linearity.

What is claimed is:

1. A linearity-corrected deflection circuit comprising:
    a deflection winding;
    first switching means switched at a deflection rate and coupled to said deflection winding;
    a capacitance coupled to said deflection winding and responsive to the switching of said first switching means for generating a deflection current in said deflection winding which defines a trace and retrace interval during a deflection cycle;
    a source of voltage;
    an inductance coupled to said voltage source and having first and second windings magnetically coupled to each other; and
    second switching means coupled to said inductance and to said capacitance for switching current from said capacitor alternately between said first and said second windings in order to provide substantial linearity correction to said deflection current, whereby the magnetic coupling between said first and second windings permits said current switching between said first and second windings to occur during significant levels of current flow in one of said first and second windings such that substantially instantaneous current switching occurs at all levels of current flow.

2. The arrangement defined in claim 1, wherein said first switching means comprises a horizontal deflection output transistor.

3. The arrangement defined in claim 2, wherein said second switching means comprises a driver transistor for said horizontal deflection output transistor.

4. The arrangement defined in claim 1, wherein said capacitance defines first and second capacitors, said first capacitor coupled between said deflection winding and said inductance, said second capacitor coupled between said deflection winding and a point of reference potential in order to provide S-shaping correction to said deflection current.

5. The arrangement defined in claim 1, wherein said capacitance comprises first and second capacitors, said first capacitor coupled between said deflection winding and said inductance, said second capacitor coupled between said first capacitor and a point of reference potential in order to provide S-shaping correction to said deflection current.

6. The arrangement defined in claim 1, wherein said inductance comprises a transformer winding tapped to provide first and second winding portions.

7. A linearity-corrected horizontal deflection circuit for use in a television receiver incorporating a kinescope producing an electron beam comprising:
    a first voltage source;
    a source of first horizontal rate signals;
    a horizontal deflection winding for deflecting said electron beams;
    first switching means coupled to said deflection winding, to said first voltage source and to said source of first horizontal rate signals for periodically coupling said deflection winding to said first voltage source in response to said first horizontal rate signals in order to generate a deflection current in said deflection winding which defines trace and retrace intervals;
    a capacitance coupled to said deflection winding;
    a unitary-wound inductance having first and second magnetically-coupled inductor portions, said first inductor portion having a first terminal coupled to a second voltage source and a second terminal coupled to a first terminal of said second inductor portion to form a junction, said junction coupled to said capacitance;
    a source of second horizontal rate signals; and
    second switching means coupled to a second terminal of said second inductor portion and to a point of reference potential, said second switching means responsive to said second horizontal rate signals for coupling said second voltage source to said capacitance via said first inductor portion substantially during said trace interval and for coupling said capacitance to said point of reference potential via said second inductor portion substantially during said retrace interval in order to improve the linearity of said deflection current, whereby the magnetic coupling between said first and second inductor portions permits substantial current flow in said second inductor portion to be compensated by current flow in said first inductor portion substantially instantaneously when current switching between said first and second inductor portions occur.

8. The arrangement defined in claim 7, wherein said unitary-wound inductance comprises a tapped transformer.

9. The arrangement defined in claim 7, wherein said second switching means comprises a transistor.

10. A horizontal deflection circuit comprising:
    a horizontal rate oscillator;
    a driver circuit comprising:
        a first transistor having base, emitter and collector electrodes, said base electrode being coupled to said horizontal rate oscillator, said emitter electrode being coupled to a point of reference potential; and a transformer incorporating a first winding and a second winding having first, second and an intermediately tapped third terminal, said first terminal being coupled to said transistor collector electrode;

a voltage source coupled to said second terminal of said second winding; and an output circuit comprising:

a second transistor having base, emitter and collector electrodes, said base electrode being coupled to said first winding of said transformer, said collector electrode being coupled to said voltage source;

a horizontal deflection coil having a first terminal coupled to said second transistor collector electrode and having a second terminal; and a capacitance coupled to said deflection coil second termihal and to said third terminal of said transformer second winding;

whereby said horizontal rate oscillator provides horizontal rate switching signals to said output circuit transistor via said transformer first winding for periodically coupling said voltage source to said deflection coil for generating deflection currents in said coil, said oscillator also providing switching signals for coupling said voltage source to said capacitance via said transformer second winding during a first deflection interval, and coupling said capacitance to said point of reference potential during a second deflection interval, in order to provide linearity correction to said deflection currents, said first and second deflection intervals comprising substantially a trace interval and a retrace interval, respectively.

11. A horizontal deflection circuit comprising:

a horizontal rate oscillator;

a horizontal driver transformer;

a horizontal deflection winding coupled to a first winding of said horizontal driver transformer;

a switch coupled to said horizontal deflection winding, said switch including a horizontal output transistor with a control terminal coupled to a second winding of said horizontal driver transformer;

means including a capacitance coupled to said deflection winding for developing a trace voltage;

a horizontal driver transistor coupled to said first winding of said horizontal driver transformer and responsive to said horizontal rate oscillator for switching the conductive states of said horizontal output transistor to periodically apply said trace voltage to said horizontal deflection winding to generate a horizontal scanning current; and a third winding of said horizontal driver transformer coupled to said deflection winding, the operation of said horizontal driver transistor alternately switching current from said first and third windings of said horizontal driver transformer to said horizontal deflection winding in a manner that provides substantial linearity correction of said horizontal scanning current.

* * * * *